United States Patent
Yagura et al.

(10) Patent No.: US 6,188,137 B1
(45) Date of Patent: *Feb. 13, 2001

(54) OHMIC ELECTRODE STRUCTURE, SEMICONDUCTOR DEVICE INCLUDING SUCH OHMIC ELECTRODE STRUCTURE, AND METHOD FOR PRODUCING SUCH SEMICONDUCTOR DEVICE

(75) Inventors: Motoji Yagura, Tenri; Hiroya Sato, Nara, both of (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/652,303

(22) Filed: May 23, 1996

(30) Foreign Application Priority Data

May 25, 1995 (JP) .................................................. 7-126911
May 20, 1996 (JP) .................................................. 8-125159

(51) Int. Cl.[7] ........................... H01L 23/48; H01L 23/52; H01L 29/40; H01L 31/0256
(52) U.S. Cl. ........................... 257/769; 257/383; 257/76; 257/79
(58) Field of Search .................... 257/769, 751, 257/752, 753, 744, 745, 382, 383, 750, 76, 79; 438/338, 339

(56) References Cited

U.S. PATENT DOCUMENTS

| 5,280,190 | * | 1/1994 | Lu | 257/383 |
| 5,296,698 | * | 3/1994 | Tatoh | 257/449 |
| 5,355,021 | * | 10/1994 | Crouch et al. | 257/744 |
| 5,373,175 | * | 12/1994 | Ozawa et al. | 257/744 |
| 5,429,986 | * | 7/1995 | Okada | 437/184 |

FOREIGN PATENT DOCUMENTS

| 3419-225 | * | 12/1984 | (DE) | 257/745 |
| 60-10774 | * | 1/1985 | (JP) | 257/744 |
| 1194468 |   | 8/1989 | (JP) . |  |
| 2-46773 | * | 2/1990 | (JP) | 257/745 |
| 224384 |   | 5/1990 | (JP) . |  |
| 3219674 |   | 9/1991 | (JP) . |  |
| 3239364 |   | 10/1991 | (JP) . |  |
| 6310706 |   | 11/1994 | (JP) . |  |

OTHER PUBLICATIONS

IEEE Electron Device Letters, vol. EDL–8, No. 11, Nov. 1987, pp. 534–536.
Electronics Letters 21st Jan. 1988, vol. 24, No. 2, pp. 93–94.
Koichi Nagata et al, "Self–Aligned AlGaAs/GaAs HBT with Low Emitter Resistance Utilizing InGaAs Cap Layer", IEEE Transactions On Electron Devices, vol. ED–35, No. 1, pp. 2–7, Jan. 1988).
T. Iwai et al, "1.5V Low–Voltage Microwave Power Performance of InAlAs/InGaAs Double Heterojunction Bipolar Transistors", Extended Abstracts of the 1995 International Conference on Solid State Devices and Materials, Osaka, 1995, pp. 386–388.

* cited by examiner

Primary Examiner—Mahshid Saadat
Assistant Examiner—Jhihan B. Clark

(57) ABSTRACT

An ohmic electrode structure includes an n-$In_xGa_{1-x}As$ layer where $0<x\leq1$; a Pt or Pd layer provided on the n-$In_xGa_{1-x}As$ layer; and at least one metal layer provided on the Pt or Pd layer. A semiconductor device includes a substrate; a first semiconductor layer having a p-type conductivity provided on the substrate; a second semiconductor layer having an n-type conductivity provided on the substrate; an ohmic contact layer provided on the first semiconductor layer; a barrier layer provided on the second semiconductor layer; a first electrode provided on the ohmic contact layer; and a second electrode provided on the barrier layer. The ohmic contact layer and the barrier layer are each formed of a material selected from the group consisting of Pt and Pd.

6 Claims, 6 Drawing Sheets

OHMIC ELECTRODE STRUCTURE, SEMICONDUCTOR DEVICE INCLUDING SUCH OHMIC ELECTRODE STRUCTURE, AND METHOD FOR PRODUCING SUCH SEMICONDUCTOR DEVICE

BACKGROUND OF THE INVENTION

1. Field of the Invention

The present invention relates to an ohmic electrode structure provided in a compound semiconductor device, a semiconductor device including such an ohmic electrode structure; and a method for producing such a semiconductor device.

2. Description of the Related Art

In a conventionally known method for providing ohmic contact with an n-GaAs layer in a compound semiconductor device, an $In_xGa_{1-x}As$ layer ($0<x\leq1$) is epitaxially grown on an n-GaAs layer, and then a metal or alloy layer is formed thereon.

Figure 9:
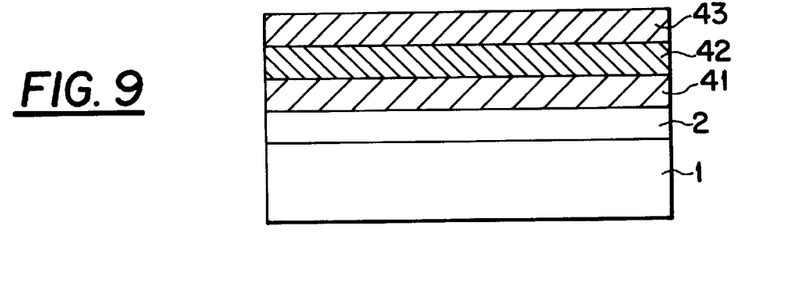
FIGS. 9 and 10 are cross sectional views of conventional ohmic electrode structures.
Figure 10:
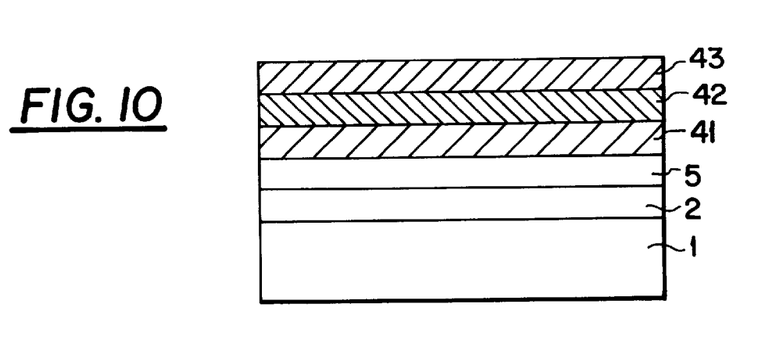

FIGS. 9 and 10 each show a conventional ohmic electrode structure.

In the structure shown in FIG. 9, an $In_xGa_{1-x}As$ layer 2 is provided on an n-GaAs substrate 1, and a Ti layer 41, a Pt layer 42 and a Au layer 43 are provided on the $In_xGa_{1-x}As$ layer 2 in this order. The Ti layer 41, the Pt layer 42 and the Au layer 43 form an electrode.

In such a structure, since the three metal layers 41 through 43 forming the electrode easily react with the $In_xGa_{1-x}As$ layer 2 which is lattice-mismatched, the heating temperature cannot be very high after the electrode is formed. For example, when the structure is heated at 390° C. for 1 minute, the contact resistance ρc increases by about three orders, from $1\times10^{-8}$ $\Omega cm^2$ to $1\times10^{-5}$ $\Omega cm^2$.

In the structure shown in FIG. 10, which is disclosed in Japanese Laid-Open Patent Publication No. 1-194468, a barrier layer 5 formed of tungsten silicide (WSi) is interposed between the $In_xGa_{1-x}As$ layer 2 and the Ti layer 41.

In such a structure, the contact resistance is stable with no significant increase even if the structure is heated at 400° C. or more due to the presence of the barrier layer 5. However, in the case when the barrier layer 5 is formed by sputtering, it is difficult to obtain a desirable composition for the barrier layer 5 because the sputtering efficiency of tungsten is different from that of silicon. Further, the purity of WSi, which is a sintered body, cannot be very high. Moreover, WSi is generally present in a columnar polycrystalline structure, and thus is difficult to process, which complicates the formation of the ohmic electrode structure.

In a conventional semiconductor device such as a heterojunction bipolar transistor (HBT) including semiconductor layers respectively having p-type and n-type conductivities on one substrate, different electrodes need to be formed respectively for the semiconductor layers. This is because materials which can be used for different electrodes to be in ohmic contact with the p-type and n-type semiconductor layers are different from each other. Thus, the fabrication process of the semiconductor device is complicated, and the electrodes easily become non-uniform in thickness and characteristics.

SUMMARY OF THE INVENTION

According to one aspect of the present invention, an ohmic electrode structure includes an n-$In_xGa_{1-x}As$ layer where $0<x\leq1$; a Pt layer provided on the n-$In_xGa_{1-x}As$ layer; and at least one metal layer provided on the Pt layer.

According to another aspect of the present invention, an ohmic electrode structure includes an n-$In_xGa_{1-x}As$ layer where $0<x\leq1$; a Pd layer provided on the n-$In_xGa_{1-x}As$ layer; and at least one metal layer provided on the Pd layer.

According to still another aspect of the present invention, a semiconductor device includes a substrate; a first semiconductor layer having a p-type conductivity provided on the substrate; a second semiconductor layer having an n-type conductivity provided on the substrate; an ohmic contact layer provided on the first semiconductor layer; a barrier layer provided on the second semiconductor layer; a first electrode provided on the ohmic contact layer; and a second electrode provided on the barrier layer. The ohmic contact layer and the barrier layer are each formed of a material selected from the group consisting of Pt and Pd.

According to still another aspect of the present invention, a method for producing a semiconductor device includes the steps of forming a multi-layer structure including a first semiconductor region having a first conductivity type and a second semiconductor region having a second conductivity type on a semiconductor substrate; forming a layer of a metal selected from the group consisting of Pt and Pd so as to cover the first semiconductor region and the second semiconductor region; forming at least one metal layer on the layer of the metal selected from the group consisting of Pt and Pd; and patterning the at least one metal layer and the layer of the metal selected from the group consisting of Pt and Pd to form at least on ohmic electrode on each of the first semiconductor region and the second semiconductor region.

Thus, the invention described herein makes possible the advantages of (1) providing an ohmic electrode structure which remains stable in contact resistance after heating at a high temperature and can be produced relatively easily, and (2) providing a semiconductor device including an ohmic electrode structure which can be in ohmic contact with semiconductor layers of both p-type and n-type conductivities and a method for producing the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
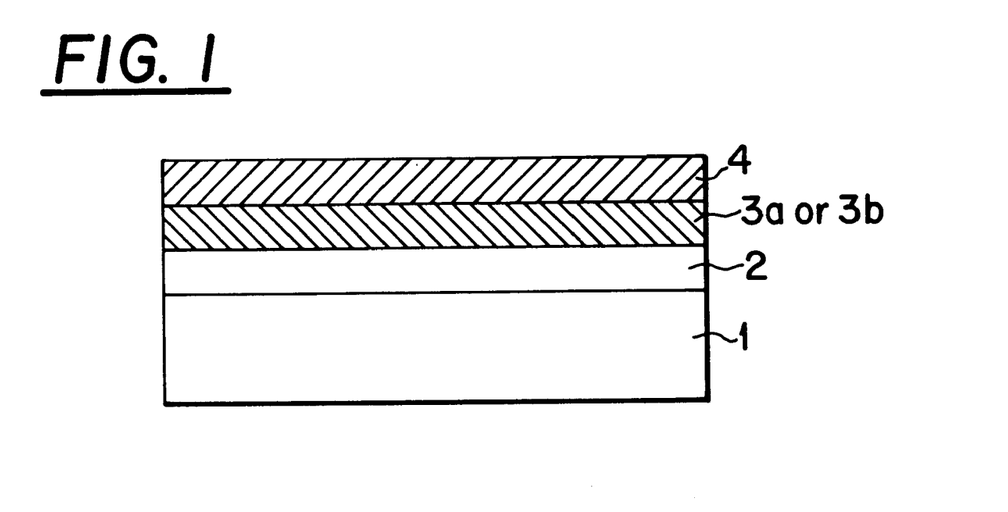
FIG. 1 is a cross sectional view of an ohmic electrode structure in an example according to the present invention.

FIG. 1 is a schematic cross sectional view of an ohmic electrode structure according to the present invention. As shown in FIG. 1, the ohmic electrode substrate includes a compound semiconductor layer 1, an $In_xGa_{1-x}As$ layer 2 provided on the compound semiconductor layer 1, and at least one metal layer 4 provided on the $In_xGa_{1-x}As$ layer 2, and a Pt layer 3a (or a Pd layer 3b) interposed between the $In_xGa_{1-x}As$ layer 2 and the metal layer 4. The Pt layer 3a (or the Pd layer 3b), which acts as a barrier layer, reliably prevents diffusion of the atoms in the metal layer 4 into the $In_xGa_{1-x}As$ layer 2 and also prevents diffusion of the atoms in the $In_xGa_{1-x}As$ layer 2 into the metal layer 4 when the ohmic electrode structure is heated to a high temperature (e.g., 410° C.). Accordingly, even if the ohmic electrode structure is heated to such a high temperature after the ohmic electrode (namely, the metal layer 4) is formed, the contact resistance of the ohmic electrode can be stably maintained at a sufficiently low level.

The same effect can be obtained whether it is the Pt layer 3a or the Pd layer 3b that is interposed between the $In_xGa_{1-x}As$ layer 2 and the metal layer 4. Since the Pt layer 3a or the Pd layer 3b can be easily formed by vapor deposition or the like, the ohmic electrode structure can be formed more easily than the ohmic electrode structure including a barrier layer formed of WSi or the like.

A semiconductor device according to the present invention includes at least one ohmic electrode structure on a semiconductor region of a p-type conductivity and also at least one ohmic electrode structure on a semiconductor region of an n-type conductivity which is provided on the same substrate as the p-type semiconductor region.

The ohmic electrode structures both include a Pt or Pd layer and at least one metal layer. The Pt or Pd layer is provided for the electrodes which form ohmic contact with the p-type and n-type semiconductor regions. By forming the p-type semiconductor region and the n-type semiconductor region on the substrate, forming the Pt or Pd layer and the metal layer on each of the p-type and n-type semiconductor regions, and patterning the Pt or Pd layer and the metal layer into islands, a plurality of electrode structures can be formed simultaneously.

The p-type and n-type semiconductor regions can be produced on the substrate in the following manner. The p-type semiconductor layer is formed on the substrate and the n-type semiconductor layer including an $n-In_xGa_{1-x}As$ layer ($0<x\leq1$) as the top layer is formed on the p-type semiconductor layer. The n-type semiconductor layer including the $n-In_xGa_{1-x}As$ layer is partially removed to expose the p-type semiconductor layer, which is used as the p-type semiconductor region. Thus, the ohmic electrode structures can be formed on both of the n-type semiconductor layer (region) and the p-type semiconductor region simultaneously.

Alternatively, the n-type semiconductor layers including the $n-In_xGa_{1-x}As$ layer ($0<x\leq1$) as the top layer are formed on the substrate. Then, the $n-In_xGa_{1-x}As$ layer is partially removed, and a p-type region is formed in the exposed n-type semiconductor layer. In this manner also, the ohmic electrode structures can be formed on both of the n-type and p-type semiconductor regions simultaneously.

In the case where the Pd layer 3b is used as the barrier layer, the at least one metal layer 4 may include a Pd layer in lieu of a Pt layer because Pd is electrically similar to Pt. In such a case, the barrier layer below the metal layer and one of the metal layers are formed of the same material, which reduces the production cost.

Hereinafter, practical examples of the present invention will be described.

EXAMPLE 1

Figure 2:
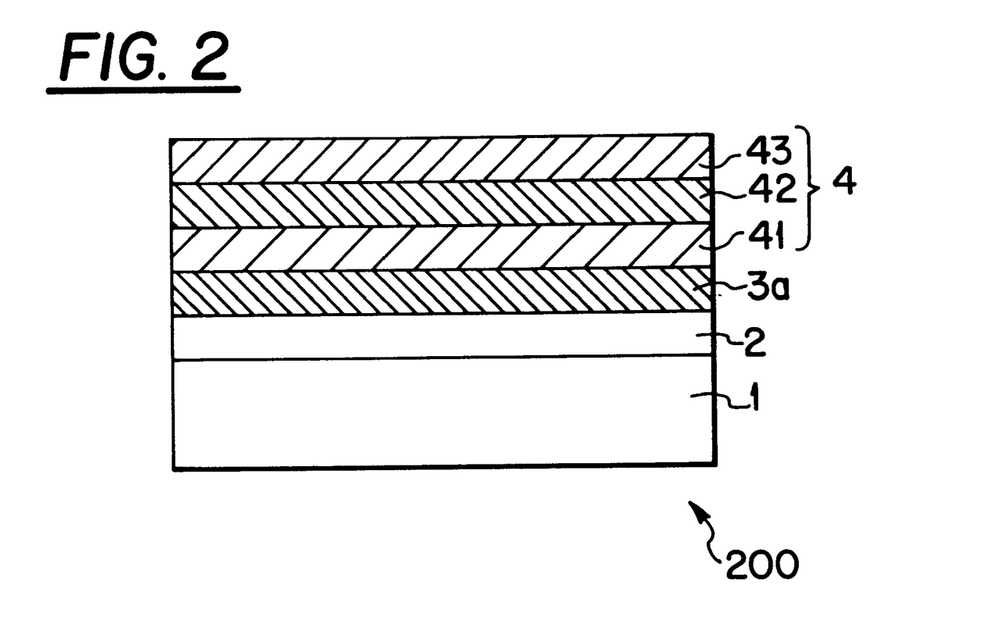
FIG. 2 is a cross sectional view of an ohmic electrode structure in a first example according to the present invention.

FIG. 2 shows a cross sectional view of an ohmic electrode structure 200 in a first example according to the present invention.

The ohmic electrode structure 200 includes a compound semiconductor layer 1 formed of GaAs. The ohmic electrode structure 200 further includes an $n^+-In_xGa_{1-x}As$ layer 2 (x=0.66; concentration of the n-type impurity: $2\times10^{19}$ $cm^{-3}$), a Pt layer 3a as a barrier layer, and an electrode 4 which are provided on the compound semiconductor layer 1 in this order. The electrode 4 includes a Ti layer 41, a Pt layer 42, and a Au layer 43. A nitride layer (for example, a SiN layer; not shown) is provided between the $n^+-In_xGa_{1-x}As$ layer 2 and the Pt layer 3a.

The ohmic electrode structure 200 is formed in the following manner.

On the compound semiconductor layer 1, the $n^+-In_xGa_{1-x}As$ layer 2 is deposited to a thickness of 100 nm using MOCVD (metalorganic chemical vapor deposition), and the SiN layer is deposited thereon to a thickness of 250 nm using P-CVD (plasma CVD).

Next, a photoresist layer (not shown) is formed on the SiN layer and patterned to form a mask. The SiN layer is selectively etched with buffered hydrogen fluoride using the mask to partially expose the $n^+-In_xGa_{1-x}As$ layer 2.

Then, the Pt layer 3a is vapor-deposited to a thickness of 50 nm. The Ti layer 41 having a thickness of 50 nm, the Pt layer 42 having a thickness of 50 nm, and the Au layer 43 having a thickness of 100 nm are vapor-deposited thereon in this order.

The mask and areas of the layers 3a, 41, 42 and 43 which positionally correspond to the mask are dissolved to be removed (lift-off). The remaining areas of the metal layers 41, 42 and 43 form the ohmic electrode 4.

The ohmic electrode structure 200 obtained in this manner has a sufficiently low contact resistance $\rho c$ of $3\times10^{-7}$ $\Omega cm^2$.

Figure 3:
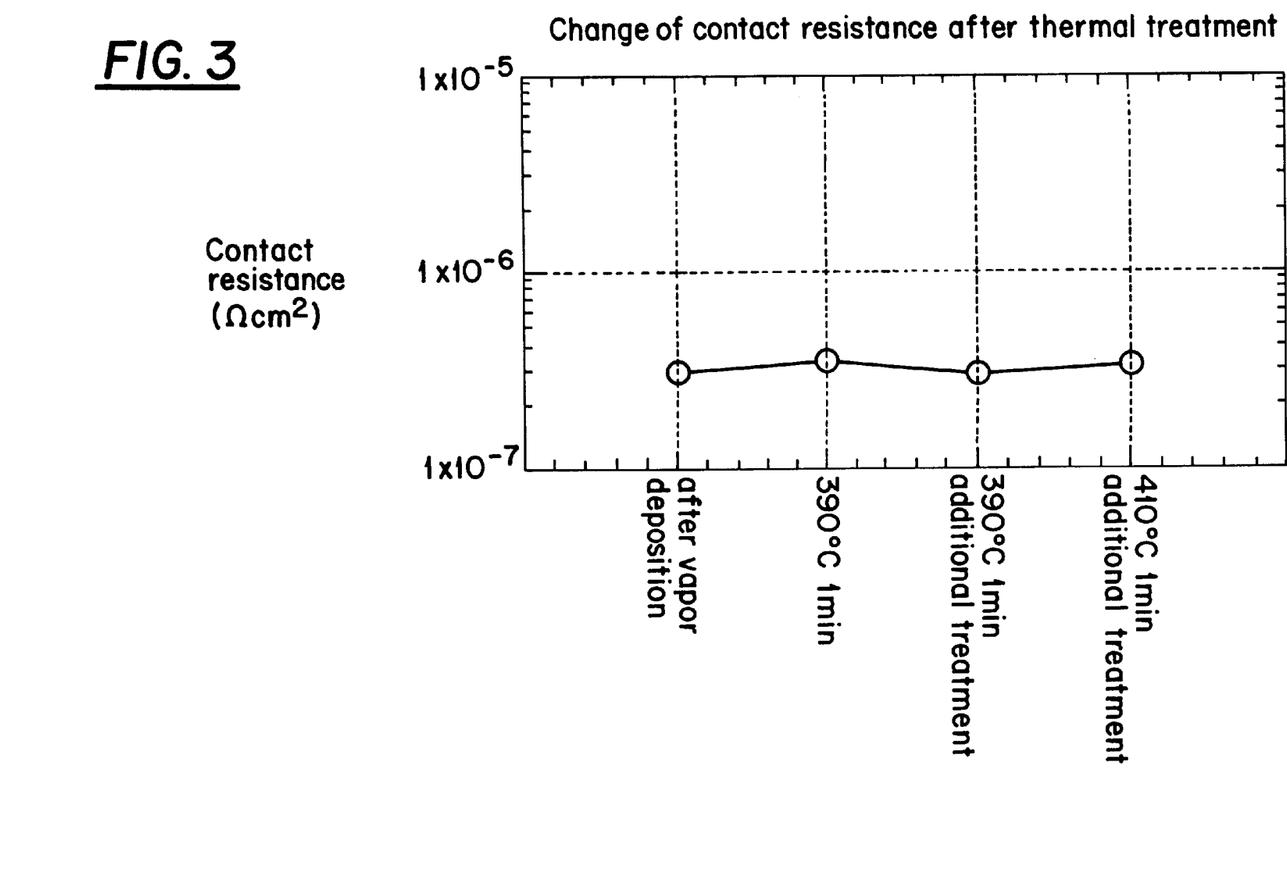
FIG. 3 is a graph illustrating the contact resistance of the ohmic electrode structure shown in FIG. 2 in relation to the temperature and time of thermal treatment.

FIG. 3 is a graph illustrating the contact resistance of the ohmic electrode structure 200 in relation to the time and temperature of thermal treatment. As appreciated from FIG. 3, the contact resistance of the ohmic electrode structure 200 does not substantially change even when heated at a temperature as high as 390° C. for total 2 minutes and at 410° C. for another 1 minute.

Such an ohmic electrode structure is useful for a transistor which needs to be resistant against heat, and especially preferable as an emitter electrode of a heterojunction bipolar transistor (HBT).

EXAMPLE 2

Figure 4:
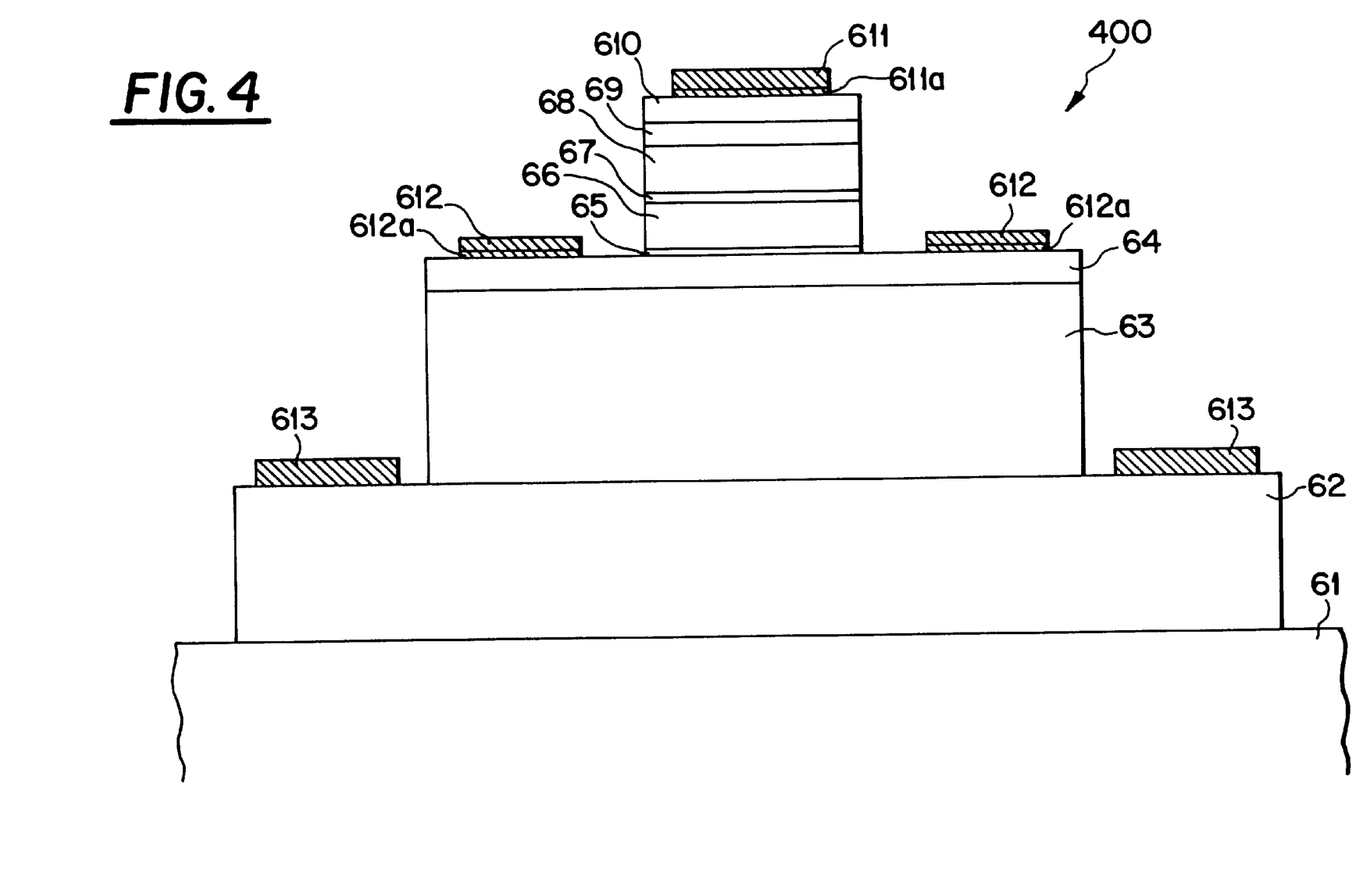
FIG. 4 is a cross sectional view of a semiconductor device in a second example according to the present invention.

FIG. 4 is a cross sectional view of an HBT 400 as a semiconductor device in a second example according to the present invention.

The HBT 400 includes semiconductor layers of both p-type and n-type conductivities provided on one substrate, and an ohmic electrode structure according to the present invention is used each as an emitter electrode and a base electrode thereof.

As shown in FIG. 4, the HBT 400 includes a semi-insulative GaAs substrate 61. The HBT 400 further includes an $n^+$-GaAs sub-collector layer 62 (concentration of the n-type impurity: $5\times10^{18}$ $cm^{-3}$), an n-GaAs collector layer 63

(concentration of the n-type impurity: $2 \times 10^{15}$ cm$^{-3}$), a p$^+$-GaAs base layer 64 (concentration of the p-type impurity: $2 \times 10^{19}$ cm$^{-3}$) which are provided on the substrate 61 in this order. The HBT 400 still further includes an n-Al$_x$Ga$_{1-x}$As graded layer 65 (x=0 to 0.3; concentration of the n-type impurity: $5 \times 10^{17}$ cm$^{-3}$), an n-Al$_x$Ga$_{1-x}$As emitter layer 66 (x=0.3; concentration of the n-type impurity: $5 \times 10^{17}$ cm$^{-3}$), an n-Al$_x$Ga$_{1-x}$As graded layer 67 (x=0.3 to 0; concentration of the n-type impurity: $5 \times 10^{17}$ cm$^{-3}$), an n$^+$-GaAs contact layer 68 (concentration of the n-type impurity: $5 \times 10^{18}$ cm$^{-3}$), an n$^+$-In$_y$Ga$_{1-y}$As graded layer 69 (y=0 to 0.3; concentration of the n-type impurity: $2 \times 10^{19}$ cm$^{-3}$), an n$^+$-In$_{y'}$Ga$_{1-y'}$As cap layer 610 (y'=0.5; concentration of the n-type impurity: $2 \times 10^{19}$ cm$^{-3}$) which are provided on the base layer 64 in this order.

The above-mentioned layers are provided so that top surfaces of the sub-collector layer 62, the base layer 64, and the cap layer 610 are partially exposed. A Pt layer 611a as a barrier layer and an emitter ohmic electrode 611 including Ti, Pt and Au layers are provided on the cap layer 610. Pt layers 612a as ohmic contact layers and base ohmic electrodes 612 each including Ti, Pt and Au layers are provided on the base layer 64. On the sub-collector layer 62, collector electrodes 613 each including AuGe, Ni and Au layers are provided.

The HBT 400 is formed in the following manner.

On the GaAs substrate 61, the n$^+$-GaAs sub-collector layer 62 having a thickness of 500 nm, the n-GaAs collector layer 63 having a thickness of 700 nm, the p$^+$-GaAs base layer 64 having a thickness of 80 nm, the n-Al$_x$Ga$_{1-x}$As graded layer 65 having a thickness of 20 nm, the n-Al$_x$Ga$_{1-x}$As emitter layer 66 having a thickness of 120 nm, the n-Al$_x$Ga$_{1-x}$As graded layer 67 having a thickness of 20 nm, the n$^+$-GaAs contact layer 68 having a thickness of 100 nm, the n$^+$-In$_y$Ga$_{1-y}$As graded layer 69 having a thickness of 50 nm, and the n$^+$-In$_{y'}$Ga$_{1-y'}$As cap layer 610 having a thickness of 50 nm are formed in this order, using MBE (molecular beam epitaxy) or the like.

On the resultant body of layers, a mask used for etching to form an emitter mesa is formed of a photoresist using photolithography on the cap layer 610. Then, the cap layer 610, the graded layer 69, the contact layer 68, the graded layer 67, the emitter layer 66, and the graded layer 65 are selectively etched away using an etchant containing phosphoric acid (for example, a mixture of H$_3$PO$_4$, H$_2$O$_2$ and H$_2$O) until the p$^+$-GaAs base layer 64 is partially exposed.

Next, a mask used for etching to form a base mesa is formed of a photoresist using photolithography on the base layer 64, and the base layer 64 and the collector layer 63 are selectively etched away using an etchant containing, for example, phosphoric acid, until the sub-collector layer 62 is partially exposed.

Then, the masks on the cap layer 610 and the base layer 64 are removed, and a SiN layer deposited to a thickness of 250 nm on the resultant body of layers using P-CVD. On the SiN layer, a photoresist layer is formed. The photoresist layer is patterned by photolithography to have openings in a first area where an emitter ohmic electrode is to be formed and in second areas where base ohmic electrodes are to be formed. The openings are formed simultaneously in the first and second areas. The emitter ohmic electrode is to be in n-type ohmic contact with the n-type semiconductor layer (the cap layer 610 in this case), and the base ohmic electrodes are to be in p-type ohmic contact with the p-type semiconductor layer (the base layer 64 in this case). The SiN layer is selectively etched away by hydrogen fluoride using the obtained pattern of the photoresist layer as a mask, until areas of the cap layer 610 and the base layer 64 corresponding to the openings are exposed.

Then, a Pt layer (611a, 612a) having a thickness of 50 nm is vapor-deposited on the cap layer 610 and the base layer 64. Then, the Ti layer having a thickness of 50 nm, the Pt layer having a thickness of 50 nm, and the Au layer having a thickness of 100 nm are vapor-deposited on the Pt layer in this order.

Next, the photoresist mask, areas of the Pt layer and areas of the Ti, Pt and Au layers which positionally correspond to the photoresist mask are removed using lift-off. The remaining areas of the Ti, Pt and Au layers on the cap layer 610 form the emitter ohmic electrode 611, and the remaining areas of the Ti, Pt and Au layers on the base layer 64 form the base ohmic electrodes 612. The area of the Pt layer below the emitter ohmic electrode 611 acts as the Pt layer 611a, and the areas of the Pt layer below the base ohmic electrodes 612 act as the Pt layer 612a.

On the sub-collector layer 62, AuGe, Ni and Au layers are vapor-deposited, and the collector electrodes 613 are formed in a similar manner using the mask and lift-off. Ohmic contact of the base ohmic electrode 612 and ohmic contact of the collector ohmic electrode 613 are formed simultaneously by thermal treatment performed at 390° C. for 1 minute.

Then, a mask used for etching to form a collector mesa is formed of a photoresist using photolithography on the sub-collector layer 62, and the sub-collector layer 62 is selectively etched away in a prescribed pattern until the substrate 61 is partially exposed. Thus, the HBT 400 shown in FIG. 4 isolated from other HBTs is obtained.

The contact resistance of the emitter ohmic electrode 611 of the HBT 400 is $3 \times 10^{-7}$ $\Omega$cm$^2$, which is sufficiently low. The contact resistance of the base ohmic electrode 612 is $1 \times 10^{-6}$ $\Omega$cm$^2$, which is also sufficiently low.

In such a structure, since the emitter ohmic electrode 611 and the base ohmic electrodes 612 can be formed simultaneously, the production cost of the HBT 400 can be reduced.

With respect to an n-GaAs semiconductor, low resistance ohmic contact can be easily obtained, namely, with no thermal treatment. Thus, conventionally, an electrode is formed on an n-InGaAs layer located on the n-GaAs semiconductor layer. However, the n-InGaAs layer is lattice-mismatched with the n-GaAs layer, and thus does not have a satisfactory resistance against heat. In order to avoid such a problem, a heat-resistive metal (such as a refractory metal link Tungsten (W) or Molybdenum (Mo)), a refractory metal nitride or a refractory metal silicide, or the like, is generally used as the electrode material for forming ohmic contact with the n-InGaAs layer. However, such a electrode material does not form ohmic contact with p-GaAs.

The inventors of the present invention have found that Pt and Pd, which form ohmic contact with p-GaAs have satisfactory resistance against heat with respect to n-InGaAs. Accordingly, electrode structures having a Pt layer or a Pd layer as the bottom layer can form satisfactory ohmic contact with both of the n-type semiconductor and the p-type semiconductor (p-GaAs) by forming an n-InGaAs layer on the n-type semiconductor.

Although the HBT 400 has the emitter-up npn structure (the emitter is located on the top), the present invention is applicable to a HBT of a collector-up structure (the collector is located on the top) or a pnp structure. The substrate can be formed of any semiconductor material which allows an InGaAs layer to be deposited thereon with at least one intermediate layer interposed therebetween, as well as GaAs.

EXAMPLE 3

Figure 5:
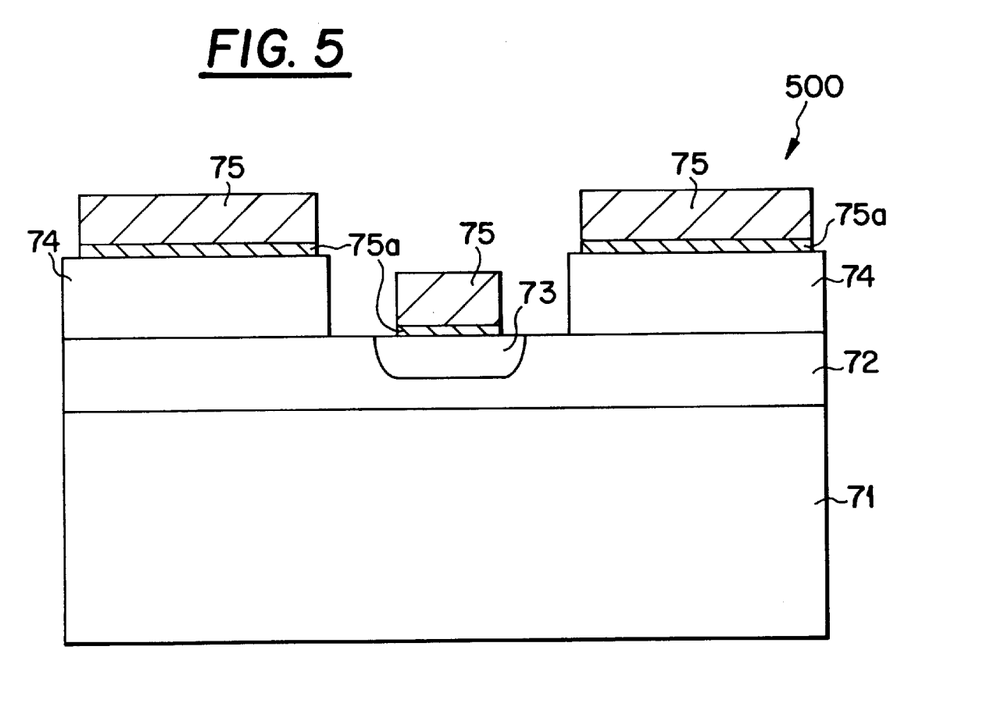
FIG. 5 is a cross sectional view of a semiconductor device in a third example according to the present invention.

FIG. 5 is a cross sectional view of a junction-type field effect transistor (J-FET) 500 as a semiconductor device in a third example according to the present invention.

As shown in FIG. 5, the J-FET 500 includes a semi-insulative GaAs substrate 71. The J-FET 500 further includes an n-GaAs layer 72 (concentration of the n-type impurity: $2 \times 10^{16}$ cm$^{-3}$) and an n$^+$-In$_x$Ga$_{1-x}$As layer 74 (x=0.5; concentration of the n-type impurity: $2 \times 10^{19}$ cm$^{-3}$) provided on the substrate 71 in this order. The n-GaAs layer 72 has a p-type region 73 which will act as a gate, and the n$^+$-In$_x$Ga$_{1-x}$As layer 74 is provided so that a part of the n-GaAs layer 72 including the p-type region 73 is exposed. Pt layers 75a and ohmic electrodes 75 each including Ti, Pt and Au layers are provided on each of the n$^+$-In$_x$Ga$_{1-x}$As layer 74 and the p-type region 73.

The J-FET 500 is formed in the following manner.

On the semi-insulative GaAs substrate 71, the n-GaAs layer 72 having a thickness of 150 nm and the n$^+$-In$_x$Ga$_{1-x}$As layer 74 having a thickness of 150 nm are deposited in this order using, for example, MBE.

Next, a photoresist layer is formed on the n$^+$-In$_x$Ga$_{1-x}$As layer 74 and patterned to have an opening in an area corresponding to the p-type region 73 to be formed later. The n$^+$-In$_x$Ga$_{1-x}$As layer 74 is selectively etched away with an etchant containing phosphoric acid (for example, a mixture of H$_3$PO$_4$, H$_2$O$_2$ and H$_2$O) using the patterned photoresist layer as a mask, until an area of the n-GaAs layer 72 corresponding to the opening is exposed. In the exposed area of the n-GaAs layer 72, the p-type region 73 is formed by a known method, for example, Zn ion implantation (impurity diffusion) and activation.

Then, a photoresist layer is formed on the resultant body of layers and patterned to have openings in areas which positionally correspond to a source ohmic electrode, a gate ohmic electrode and a drain ohmic electrode to be formed later, by photolithography. A Pt layer (75a) and the Ti, Pt and Au layers are vapor-deposited thereon, and the ohmic electrodes 75 respectively acting as the source ohmic electrode, the gate ohmic electrode and the drain ohmic electrode are formed by removing the patterned photoresist layer using lift-off. Areas of the Pt layer below the source ohmic electrode, the gate ohmic electrode and the drain ohmic electrode act as the Pt layers 75a. Thus, the J-FET 500 shown in FIG. 5 is obtained.

The contact resistance of such an ohmic electrode in the J-FET 500 is $3 \times 10^{-7}$ Ωcm$^2$, which is sufficiently low. The contact resistance is also stable against heat. Further, since the ohmic electrodes 75 can be formed in the p-type region and the n-type regions simultaneously, the production cost of the J-FET 500 can be reduced.

Although Pt is used for a barrier layer or an ohmic contact layer in the ohmic electrode structure in the first through third examples, Pd is also usable as in the following examples.

EXAMPLE 4

Figure 6:
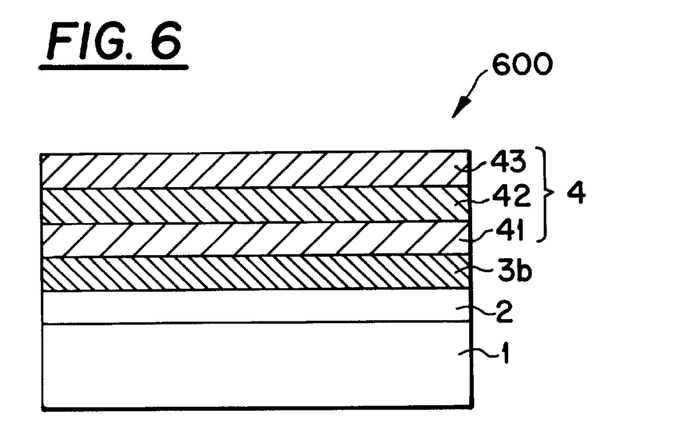
FIG. 6 is a cross sectional view of an ohmic electrode structure in a fourth example according to the present invention.

FIG. 6 shows a cross sectional view of an ohmic electrode structure 600 in a fourth example according to the present invention. Identical elements as those in the first example will bear identical reference numerals therewith.

The ohmic electrode structure 600 includes a compound semiconductor layer 1 formed of GaAs. The ohmic electrode structure 600 further includes an n$^+$-In$_x$Ga$_{1-x}$As layer 2 (x=0.66; concentration of the n-type impurity: $2 \times 10^{19}$ cm$^{-3}$), a Pd layer 3b as a barrier layer, and an electrode 4 which are provided on the compound semiconductor layer 1 in this order. The electrode 4 includes a Ti layer 41, a Pt layer 42, and a Au layer 43. A nitride layer (for example, a SiN layer; not shown) is provided between the n$^+$-In$_x$Ga$_{1-x}$As layer 2 and the Pd layer 3b.

The ohmic electrode structure 600 is formed in the following manner.

On the compound semiconductor layer 1, the n$^+$-In$_x$Ga$_{1-x}$As layer 2 is deposited to a thickness of 100 nm using MOCVD, and the SiN layer is deposited thereon to a thickness of 250 nm using P-CVD.

Next, a photoresist layer (not shown) is formed on the SiN layer and patterned to form a mask. The SiN layer is selectively etched with buffered hydrogen fluoride using the mask to partially expose the n$^+$-In$_x$Ga$_{1-x}$As layer 2.

Then, the Pd layer 3b is vapor-deposited to a thickness of 50 nm, and the Ti layer 41 having a thickness of 50 nm, the Pt layer 42 having a thickness of 50 nm, and the Au layer 43 having a thickness of 100 nm are vapor-deposited thereon in this order.

The mask, and areas of the layers 3b, 41, 42 and 43 which positionally correspond to the mask are removed using lift-off. The remaining areas of the metal layers 41, 42 and 43 form the ohmic electrode 4.

The ohmic electrode structure 600 obtained in this manner has a sufficiently low contact resistance ρc of $3 \times 10^{-7}$ Ωcm$^2$. As appreciated from FIG. 3, the contact resistance of the ohmic electrode structure 600 does not substantially change even when heated at a temperature as high as 390° C. for total 2 minutes and at 410° C. for another 1 minute.

EXAMPLE 5

Figure 7:
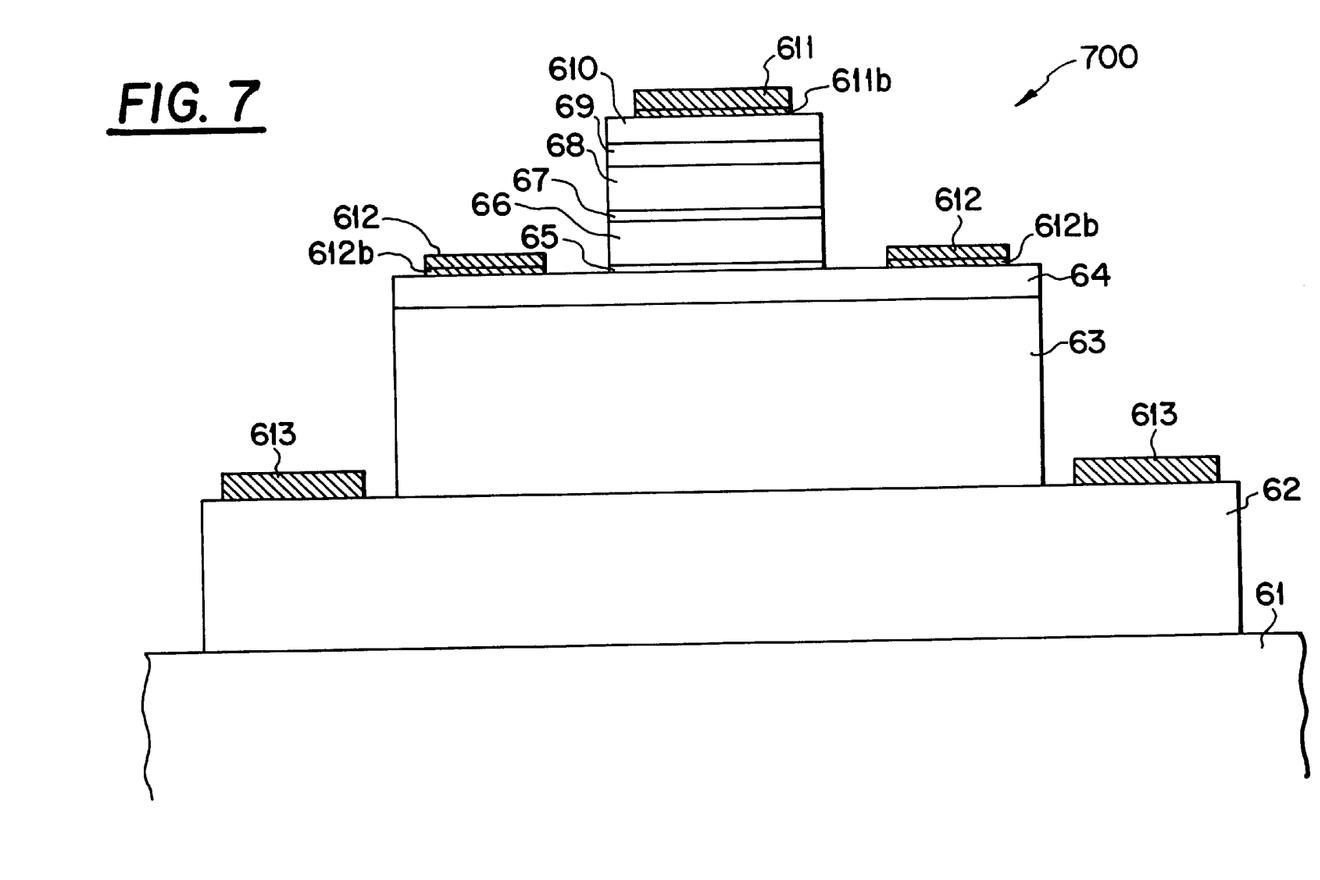
FIG. 7 is a cross sectional view of a semiconductor device in a fifth example according to the present invention.

FIG. 7 is a cross sectional view of an HBT 700 as a semiconductor device in a fifth example according to the present invention.

The HBT 700 includes semiconductor layers of both p-type and n-type conductivities on one substrate, and an ohmic electrode structure according to the present invention is used each as an emitter electrode and a base electrode thereof. Identical elements as those in the second example will bear identical reference numerals therewith.

As shown in FIG. 7, the HBT 700 includes a semi-insulative GaAs substrate 61. The HBT 700 further includes an n$^+$-GaAs sub-collector layer 62 (concentration of the n-type impurity: $5 \times 10^{18}$ cm$^{-3}$), an n-GaAs collector layer 63 (concentration of the n-type impurity: $2 \times 10^{16}$ cm$^{-3}$), a p$^+$-GaAs base layer 64 (concentration of the p-type impurity: $2 \times 10^{19}$ cm$^{-3}$) which are provided on the substrate 61 in this order. The HBT 700 still further includes an n-Al$_x$Ga$_{1-x}$As graded layer 65 (x=0 to 0.3; concentration of the n-type impurity: $5 \times 10^{17}$ cm$^{-3}$), an n-Al$_x$Ga$_{1-x}$As emitter layer 66 (x=0.3; concentration of the n-type impurity: $5 \times 10^{17}$ cm$^{-3}$), an n-Al$_x$Ga$_{1-x}$As graded layer 67 (x=0.3 to 0; concentration of the n-type impurity: $5 \times 10^{17}$ cm$^{-3}$), an n$^+$-GaAs contact layer 68 (concentration of the n-type impurity: $5 \times 10^{18}$ cm$^{-3}$), an n$^+$-In$_y$Ga$_{1-y}$As graded layer 69 (y=0 to 0.3; concentration of the n-type impurity: $2 \times 10^{19}$ cm$^{-3}$), an n$^+$-In$_{y'}$Ga$_{1-y'}$As cap layer 610 (y'=0.5; concentration of the n-type impurity: $2 \times 10^{19}$ cm$^{-3}$) which are provided on the base layer 64 in this order.

The above-mentioned layers are provided so that top surfaces of the sub-collector layer 62, the base layer 64, and the cap layer 610 are partially exposed. A Pd layer 611b as a barrier layer and an emitter ohmic electrode 611 including Ti, Pt and Au layers are provided on the cap layer 610. Pd layers 612b as ohmic contact layers and base ohmic electrodes 612 each including Ti, Pt and Au layers are provided on the base layer 64. On the sub-collector layer 62, collector electrodes 613 each including AuGe, Ni and Au layers are provided.

The HBT 700 is formed in the following manner.

On the GaAs substrate 61, the $n^+$-GaAs sub-collector layer 62 having a thickness of 500 nm, the n-GaAs collector layer 63 having a thickness of 700 nm, the $p^+$-GaAs base layer 64 having a thickness of 80 nm the n-$Al_xGa_{1-x}As$ graded layer 65 having a thickness of 20 nm, the n-$Al_xGa_{1-x}As$ emitter layer 66 having a thickness of 120 nm, the n-$Al_xGa_{1-x}As$ graded layer 67 having a thickness of 20 nm, the $n^+$-GaAs contact layer 68 having a thickness of 100 nm, the $n^+$-$In_yGa_{1-y}As$ graded layer 69 having a thickness of 50 nm, and the $n^+$-$In_{y'}Ga_{1-y'}As$ cap layer 610 having a thickness of 50 nm are formed in this order by MBE or the like.

On the resultant body of layers, a mask used for etching to form an emitter mesa is formed of a photoresist using photolithography on the cap layer 610. Then, the cap layer 610, the graded layer 69, the contact layer 68, the graded layer 67, the emitter layer 66, and the graded layer 65 are selectively etched away using an etchant containing phosphoric acid (for example, a mixture of $H_3PO_4$, $H_2O_2$ and $H_2O$) until the $p^+$-GaAs base layer 64 is partially exposed.

Next, a mask used for etching to form a base mesa is formed of a photoresist using photolithography on the base layer 64, and the base layer 64 and the collector layer 63 are selectively etched away using an etchant containing, for example, phosphoric acid until the sub-collector layer 62 is partially exposed.

Then, the masks on the cap layer 610 and the base layer 64 are removed, and a SiN layer is deposited to a thickness of 250 nm on the resultant body of layers using P-CVD. On the SiN layer, a photoresist layer is formed. The photoresist layer is patterned by photolithography to have openings in a first area where an emitter ohmic electrode is to be formed and in second areas where base ohmic electrodes are to be formed. The openings are formed simultaneously in the first and second areas. The emitter ohmic electrode is to be in n-type ohmic contact with the n-type semiconductor layer (the cap layer 610 in this case), and the base ohmic electrodes are to be in p-type ohmic contact with the p-type semiconductor layer (the base layer 64 in this case). The SiN layer is selectively etched away by hydrogen fluoride using the obtained pattern of the photoresist layer as a mask, until areas of the cap layer 610 and the base layer 64 corresponding to the openings are exposed.

Then, a Pd layer (611b, 612b) having a thickness of 50 nm is vapor-deposited on the cap layer 610 and the base layer 64. Then, the Ti layer having a thickness of 50 nm, the Pt layer having a thickness of 50 nm, and the Au layer having a thickness of 100 nm are vapor-deposited on the Pd layer in this order.

Next, the photoresist mask, and areas of the Pd layer, and areas of the Ti, Pt and Au layers which positionally correspond to the photoresist mask are removed using lift-off. The remaining areas of the Ti, Pt and Au layers on the cap layer 610 form the emitter ohmic electrode 611, and the remaining areas of the Ti, Pt and Au layers on the base layer 64 form the base ohmic electrodes 612. The area of the Pd layer below the cap layer 610 acts as the Pd layer 611b, and the areas of the Pd layer below the base ohmic electrodes 612 act as the Pd layers 612b.

On the sub-collector layer 62, AuGe, Ni and Au layers are vapor-deposited, and the collector electrodes 613 are formed in a similar manner using the mask and lift-off. Ohmic contact of the base ohmic electrode 612 and ohmic contact of the collector ohmic electrode 613 are formed simultaneously by thermal treatment performed at 390° C. for 1 minute.

Then, a mask used for etching to form a collector mesa is formed of a photoresist using photolithography on the sub-collector layer 62, and the sub-collector layer 62 is selectively etched away in a prescribed pattern until the substrate 61 is partially exposed. Thus, the HBT 700 shown in FIG. 7 isolated from other HBTs is obtained.

The contact resistance of the emitter ohmic electrode 611 of the HBT 700 is $3 \times 10^{-7}$ $\Omega cm^2$, which is sufficiently low. The contact resistance of the base ohmic electrode 612 is $1 \times 10^{-6}$ $\Omega cm^2$, which is also sufficiently low.

In such a structure, since the emitter ohmic electrode 611 and the base ohmic electrodes 612 can be formed simultaneously, the production cost of the HBT 700 can be reduced.

Although the emitter ohmic electrode 611 and the base ohmic electrodes 612 each include Ti, Pt and Au layers in this example, a Pd layer can be used in lieu of the Pt layer. In such a case, Pt is not used at all in the emitter ohmic electrode or base ohmic electrodes, and thus the production cost can be reduced.

Although the HBT 700 has the emitter-up npn structure, the present invention is applicable to a HBT of a collector-up structure or a pnp structure. The substrate can be formed of any semiconductor material which allows an InGaAs layer to be deposited thereon with at least one intermediate layer interposed therebetween, as well as GaAs.

EXAMPLE 6

Figure 8:
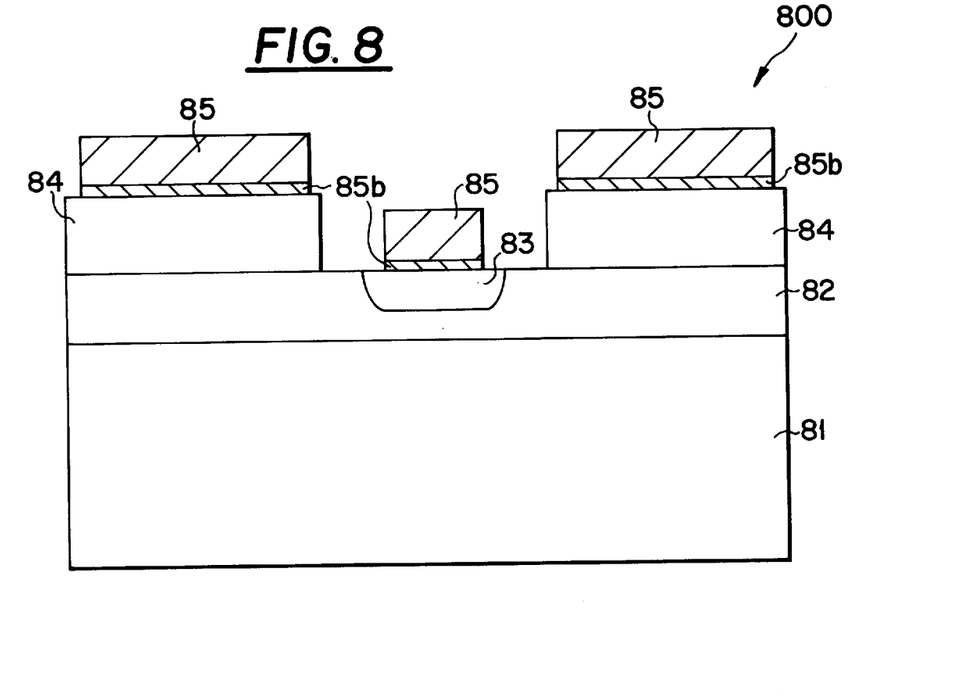
FIG. 8 is a cross sectional view of a semiconductor device in a sixth example according to the present invention.

FIG. 8 is a cross sectional view of a J-FET 800 as a semiconductor device in a sixth example according to the present invention.

As shown in FIG. 8, the J-FET 800 includes a semi-insulative InP substrate 81. The J-FET 800 further includes an n-$In_xGa_{1-x}As$ layer 82 ($0 < x \leq 1$) and an n-$In_{x'}Ga_{1-x'}As$ layer 84 ($0 < x' \leq 1$) provided on the substrate 81 in this order. The n-$In_xGa_{1-x}As$ layer 82 has a p-type region 83 which will act as a gate, and the n-$In_{x'}Ga_{1-x'}As$ layer 84 is provided so that a part of the n-$In_xGa_{1-x}As$ layer 82 including the p-type region 83 is exposed. Pd layers 85b and ohmic electrodes 85 each including Ti, Pt and Au layers are provided on each of the n-$In_{x'}Ga_{1-x'}As$ layer 84 and the p-type region 83.

The J-FET 800 is formed in the following manner.

On the semi-insulative InP substrate 81, the n-$In_xGa_{1-x}As$ layer 82 having a thickness of 150 nm and the n-$In_{x'}Ga_{1-x'}As$ layer 84 having a thickness of 150 nm are vapor-deposited in this order using, for example, MBE.

Next, a photoresist layer is formed on the n-$In_{x'}Ga_{1-x'}As$ layer 84 and patterned to have an opening in an area corresponding to the p-type region 83 to be formed later. The n-$In_{x'}Ga_{1-x'}As$ layer 84 is selectively etched away with an etchant containing phosphoric acid (for example, a mixture of $H_3PO_4$, $H_2O_2$ and $H_2O$) using the patterned photoresist layer as a mask, until an area of the n-$In_xGa_{1-x}As$ layer 82 corresponding to the opening is exposed. In the exposed area of the n-$In_xGa_{1-x}As$ layer 82, the p-type region 83 is formed by a known method, for example, Zn ion implantation and activation.

Then, a SiN layer is vapor-deposited to a thickness of 250 nm on the resultant body of layers using P-CVD. A photoresist layer is formed thereon and patterned. Next, the p-type region 83 and the n-In$_x$Ga$_{1-x}$As layer 84 are exposed in areas which positionally correspond to a source ohmic electrode, a gate ohmic electrode and a drain ohmic electrode to be formed later, by photolithography.

A Pd layer (85b) having a thickness of 50 nm, the Ti layer (thickness: 50 nm), the Pt layer (thickness: 50 nm), and Au layer (thickness: 100 nm) are vapor-deposited thereon, and the ohmic electrodes 85 respectively acting as the source ohmic electrode, the gate ohmic electrode and the drain ohmic electrode are formed by removing the patterned photoresist using lift-off. Areas of the Pd layer below the source ohmic electrode, the gate ohmic electrode and the drain ohmic electrode act as the Pd layers 85b. Thus, the J-FET 800 shown in FIG. 8 is obtained.

The contact resistance of such an ohmic electrode in the J-FET 800 is $3 \times 10^{-7}$ $\Omega$cm$^2$, which is sufficiently low. The contact resistance is also stable against heat. Further, since the ohmic electrodes 85 can be formed in the p-type region and the n-type regions simultaneously, the production cost of the J-FET 800 can be reduced.

The present invention is not restricted to the above-described examples. The ohmic electrodes may each include any number of layers. Other types of metal may also be used for the electrodes.

In the above-described examples, the metal layers, the barrier layer and ohmic contact layers are formed by vapor deposition. Such metal layers, barrier layer and ohmic contact layers may be formed by other methods such as sputtering and CVD.

The alloy composition ratio "x" of the n-In$_x$Ga$_{1-x}$As layer ($0 < x \leq 1$) is not restricted to the values described above. A larger alloy composition ratio reduces the bandgap and also reduces the contact resistance. A higher concentration of the n-type impurity reduces the contact resistance. The alloy composition ratio "x" and the concentration of the n-type impurity are preferably selected so that the contact resistance is $1 \times 10^{-6}$ $\Omega$cm$^2$ or less.

In the above-described examples, the Pt layer and the Pd layer as the barrier layers or the ohmic contact layers have a thickness of 50 nm. The Pt layer and the Pd layer may have any thickness that prevents the metal in the ohmic electrode from diffusing to the In$_x$Ga$_{1-x}$As layer and prevents the metal in the In$_x$Ga$_{1-x}$As layer from diffusing to the ohmic electrode. For example, the Pt layer and the Pd layer each preferably have a thickness of 10 nm to 100 nm.

Use of Pt for an electrode is disclosed in, for example, Japanese Patent Publication No. 2-24384, and Japanese Laid-Open Patent Publication Nos. 3-239364 and 3-219674. In Japanese Patent Publication No. 2-24384, Pt is used for an electrode which is in ohmic contact with a p-GaAs layer. In Japanese Laid-Open Patent Publication No. 3-239364, an electrode including Pt, Ti, Pt and Au layers is superposed by a solder metal having a low melting point containing In or the like to prevent diffusion of atoms of the solder metal and also to prevent reduction in adhering strength. In Japanese Laid-Open Patent Publication No. 3-219674, an electrode pad including Pt, Ti, Pt and Au layers is used to prevent the electrode from being peeled off during wire bonding.

As has been described so far, an ohmic electrode structure according to the present invention includes a Pt layer or a Pd layer interposed between the In$_x$Ga$_{1-x}$As layer ($0 < x \leq 1$) and the ohmic electrode. Due to such a structure, the contact resistance of the ohmic electrode structure is low and stable against heating. Further, the Pt layer and the Pd layer, which can be formed relatively easily, facilitates the production of the ohmic electrode structure.

In a semiconductor device according to the present invention, an ohmic electrode including at least one metal layer is formed on each of a p-type semiconductor layer and an n-type semiconductor layer with a Pt or Pd layer interposed therebetween as a barrier layer or an ohmic contact layer. Such ohmic electrodes are respectively in ohmic contact with the p-type and n-type semiconductor layers. Since such ohmic electrodes are formed simultaneously, the semiconductor device can be produced more easily and at lower cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An ohmic electrode structure, comprising:

an n-In$_x$Ga$_{1-x}$As layer, wherein x is greater than or equal 0.5 and an impurity concentration of the n-In$_x$Ga$_{1-x}$As layer is greater than or equal to $2 \times 10^{19}$ cm$^{-3}$;

a Pt layer provided on the n-In$_x$Ga$_{1-x}$As layer; and at least one metal layer provided on the Pt layer, wherein an ohmic contact is formed between the n-In$_x$Ga$_{1-x}$As layer and the Pt layer, the contact resistance of the Pt layer and the n-In$_x$Ga$_{1-x}$As layer being less than or equal to $1 \times 10^{-6}$ $\Omega$cm$^2$.

2. An ohmic electrode structure, comprising:

an n-In$_x$Ga$_{1-x}$As layer, wherein x is greater than or equal to 0.5 and an impurity concentration of the n-In$_x$Ga$_{1-x}$As layer is greater than or equal to $2 \times 10^{19}$ cm$^{-3}$;

a Pd layer provided on the n-In$_x$Ga$_{1-x}$As layer; and at least one metal layer provided on the Pd layer, wherein an ohmic contact is formed between the n-In$_x$Ga$_{1-x}$As layer and the Pd layer, the contact resistance of the Pd layer and the n-In$_x$Ga$_{1-x}$As layer being less than or greater than $1 \times 10^{-6}$ $\Omega$cm$^2$.

3. A heterojunction bipolar transistor having an emitter-up structure including an emitter ohmic electrode structure and a base ohmic electrode structure, the emitter ohmic electrode structure comprising:

an n-In$_x$Ga$_{1-x}$As layer, wherein x is greater than or equal to 0.5 and an impurity concentration of the n-In$_x$Ga$_{1-x}$As layer is greater than or equal to $2 \times 10^{19}$ cm$^{-3}$;

a Pt layer provided on the n-In$_x$Ga$_{1-x}$As layer; and at least one metal layer provided on the Pt layer, wherein an ohmic contact formed between the n-In$_x$Ga$_{1-x}$As layer and the Pt layer, the contact resistance of the Pt layer and the n-In$_x$Ga$_{1-x}$As layer being less than or equal to $1 \times 10^{-6}$ $\Omega$cm$^2$, the base ohmic electrode structure comprising:

the Pt layer; and at least one metal layer provided on the Pt layer.

4. A heterojunction bipolar transistor having a collector-up structure including a collector ohmic electrode structure and a base ohmic electrode structure, the collector ohmic electrode structure comprising:

an n-In$_x$Ga$_{1-x}$As layer where $0 < x \leq 1$;

a Pt layer provided on the n-In$_x$Ga$_{1-x}$As layer; and at least one metal layer provided on the Pt layer;

the base ohmic electrode structure comprising:

the Pt layer; and at least one metal layer provided on the Pt layer.

5. A heterojunction bipolar transistor having an emitter-up structure including an emitter ohmic electrode structure and a base ohmic electrode structure, the emitter ohmic electrode structure comprising:

an n-$In_xGa_{1-x}As$ layer, wherein x is greater than or equal to 0.5 and an impurity concentration of the n-$In_xGa_{1-x}As$ layer is greater than or equal to $2\times10^{19}$ cm$^{-3}$;

a Pd layer provided on the n-$In_xGa_{1-x}As$ layer; and at least one metal layer provided on the Pd layer, wherein an ohmic contact is formed between the n-$In_xGa_{1-x}As$ layer and the Pd layer, the contact resistance of the Pd layer and the $In_xGa_{1-x}As$ layer being less than or equal to $1\times10^{-6}$ $\Omega$cm$^2$;

the base ohmic electrode structure comprising:

the Pd layer; and at least more than one metal layer provided on the Pd layer.

6. A heterojunction bipolar transistor having a collector-up structure including a collector ohmic electrode structure and a base ohmic electrode structure, the collector ohmic electrode structure comprising:

an n-$In_xGa_{1-x}As$ layer where $0<x\leq1$;

a Pd layer provided on the n-$In_xGa_{1-x}As$ layer; and at least one metal layer provided on the Pd layer, the base ohmic electrode structure comprising:

the Pd layer; and at least more than one metal layer provided on the Pd layer.

* * * * *